United States Patent
Goodwin et al.

(10) Patent No.: US 7,455,892 B2
(45) Date of Patent: Nov. 25, 2008

(54) METHOD AND APPARATUS FOR FORMING A COATING

(75) Inventors: Andrew James Goodwin, Cork (IE); Luke Ward, Durham (GB); Patrick Merlin, Neufvilles (BE); Jas Pal Singh Badyal, County Durham (GB)

(73) Assignee: Dow Corning Ireland Limited, Cork (IE)

( * ) Notice: Subject to any disclaimer, the term of this patent is extended or adjusted under 35 U.S.C. 154(b) by 413 days.

(21) Appl. No.: 10/381,690

(22) PCT Filed: Sep. 25, 2001

(86) PCT No.: PCT/GB01/04272

§ 371 (c)(1),
(2), (4) Date: Mar. 25, 2003

(87) PCT Pub. No.: WO02/28548

PCT Pub. Date: Apr. 11, 2002

(65) Prior Publication Data

US 2004/0022945 A1 Feb. 5, 2004

(30) Foreign Application Priority Data

Oct. 4, 2000 (GB) ................................. 0024230.5
Jun. 19, 2001 (GB) ................................. 0114877.4

(51) Int. Cl.
*H05H 1/24* (2006.01)
*H05H 1/00* (2006.01)
(52) U.S. Cl. .................. 427/578; 427/569; 427/576
(58) Field of Classification Search ............... 427/569, 427/574
See application file for complete search history.

(56) References Cited

U.S. PATENT DOCUMENTS

| 4,212,719 A | * | 7/1980 | Osada et al. ................. 204/165 |
| 4,582,746 A | * | 4/1986 | Shirahata et al. ............ 428/216 |
| 4,588,641 A | * | 5/1986 | Haque et al. ................. 428/413 |
| 4,929,319 A |   | 5/1990 | Dinter et al. |

(Continued)

FOREIGN PATENT DOCUMENTS

DE 19546187 6/1997

(Continued)

OTHER PUBLICATIONS

Schutze et al. "The Atmospheric-Pressure Plasma Jet: A Review and Comparison to Other Plasma Sources". IEEE Transactions on Plasma Science, vol. 26, No. 6. Dec. 1998. pp. 1685-1694.*
English language Abstract for DE19546187 extracted from espacenet.com database dated Jan. 17, 2007.
English language Abstract for DE19742619 extracted from espacenet.com database dated Jan. 18, 2007.

(Continued)

*Primary Examiner*—Timothy H Meeks
*Assistant Examiner*—David Turocy
(74) *Attorney, Agent, or Firm*—Howard & Howard Attorneys, P.C.

(57) ABSTRACT

A method for forming a coating on a substrate using an atmospheric pressure plasma discharge. The method comprises introducing an atomized liquid and/or solid coating-forming material into an atmospheric pressure plasma discharge and/or an ionized gas stream resulting therefrom, and exposing the substrate to the atomized coating-forming material. The application also described a method for polymerizing a polymer forming material, and further to apparatus for forming a coating on a substrate.

21 Claims, 1 Drawing Sheet

U.S. PATENT DOCUMENTS

| | | | |
|---|---|---|---|
| 5,026,463 | A | 6/1991 | Dinter et al. |
| 5,041,304 | A | 8/1991 | Kusano et al. |
| 5,110,618 | A | 5/1992 | Faust |
| 5,185,132 | A | 2/1993 | Horiike et al. |
| 5,290,378 | A * | 3/1994 | Kusano et al. ........... 156/272.6 |
| 5,340,454 | A * | 8/1994 | Schaefer et al. ........ 204/192.12 |
| 5,340,618 | A | 8/1994 | Tanisaki et al. |
| 5,366,770 | A * | 11/1994 | Wang ......................... 505/477 |
| 5,414,324 | A | 5/1995 | Roth et al. |
| 5,529,631 | A | 6/1996 | Yoshikawa et al. |
| 5,543,017 | A * | 8/1996 | Uchiyama et al. ........... 204/169 |
| 5,876,753 | A | 3/1999 | Timmons et al. |
| 5,944,901 | A | 8/1999 | Landes et al. |
| 5,976,635 | A * | 11/1999 | Kinnunen ................... 427/477 |
| 6,086,710 | A | 7/2000 | Miyashita et al. |
| 6,285,032 | B1 | 9/2001 | Hahne et al. |
| 6,331,689 | B1 | 12/2001 | Branston et al. |
| 6,342,275 | B1 | 1/2002 | Miyakawa et al. |
| 6,368,665 | B1 | 4/2002 | Hunt et al. |
| 6,613,394 | B2 | 9/2003 | Kuckertz et al. |
| 6,705,127 | B1 * | 3/2004 | Cain et al. .................... 65/421 |
| 6,746,721 | B1 | 6/2004 | Moser |
| 6,800,336 | B1 * | 10/2004 | Fornsel et al. ............... 427/562 |
| 2002/0129902 | A1 | 9/2002 | Babayan et al. |
| 2004/0050685 | A1 | 3/2004 | Yara et al. |

FOREIGN PATENT DOCUMENTS

| | | | |
|---|---|---|---|
| DE | 19742619 | | 1/1999 |
| DE | 19924108 | | 11/2000 |
| EP | 0431951 | B1 | 2/1990 |
| EP | 0431951 | | 12/1990 |
| EP | 0 617 142 | A1 | 9/1994 |
| EP | 0617142 | A1 | 9/1994 |
| EP | 0809275 | | 11/1997 |
| EP | 0896035 | | 10/1999 |
| EP | 1 326 718 | B2 | 11/2002 |
| FR | 2713511 | | 6/1995 |
| GB | 2252559 | | 12/1992 |
| GB | 2326165 | | 12/1998 |
| JP | 07-062546 | | 3/1995 |
| JP | 070062546 | | 3/1995 |
| JP | 07-138761 | | 5/1995 |
| JP | 07-328427 | | 12/1995 |
| JP | 08-078529 | | 3/1996 |
| JP | 10-275698 | | 10/1998 |
| JP | 100275698 | | 10/1998 |
| JP | 110029873 | | 2/1999 |
| JP | 110241165 | | 9/1999 |
| JP | 2000-192261 | | 7/2000 |
| JP | 2000212753 | | 8/2000 |
| JP | 2000-319427 | | 11/2000 |
| JP | 2001-087643 | | 4/2001 |
| JP | 2002057440 | | 2/2002 |
| WO | WO 95/18249 | | 7/1995 |
| WO | WO 98/10116 | | 3/1998 |
| WO | WO 98/10116 | * | 5/1998 |
| WO | WO 99/05358 | * | 2/1999 |
| WO | WO9908803 | | 2/1999 |
| WO | WO0141942 | | 6/2001 |
| WO | WO0159809 | | 8/2001 |
| WO | WO0176773 | | 10/2001 |
| WO | WO0226401 | | 4/2002 |
| WO | WO0235576 | | 5/2002 |
| WO | WO02035576 | | 8/2002 |

OTHER PUBLICATIONS

English language translation for JP 07-062546 extracted from *Patent Abstracts of Japan*.

English language translation for JP 10-275698 extracted from *Patent Abstracts of Japan*.

"Plasma Spray Synthesis Of Nanomaterial Powders And Deposits", J. Karthikeyan et al., Materials Science & Engineering A238, (1997) pp. 275-286.

"Synthesis of Plasma-Polymerized Tetraethoxysilane And Hexamethyldisiloxane Films Prepared By Atmospheric Pressure Glow Discharge", Yasushi Sawada et al. Phys. D: Appl. Phys. 28 (1995) pp. 1661-1669.

"Generation of Large-Volume, Atmospheric-Pressure, Nonequilibrium Plasmas", E. E. Kunhardt, IEE Transactions on Plasma Science, vol. 28, No. 1, Feb. 2000, pp. 189-200.

"Plasma-Assisted Deposition At Atmospheric Pressure", Jürgen Salge, Surface & Coatings Technology 80 (1996) pp. 1-7.

"Plasma-Enhanced Chemical-Vapour-Deposition Of Thin Films By Corona Discharge At Atmospheric Pressure", R. Thyen et al., Surface & Coatings Technology 97 (1997) pp. 426-434.

"Atmospheric Pressure Plasmas: A Review", Claire Tendero et al., Spectrochimica Acta Part B, (2005) pp. 1-16.

Experimental And Theoretical Study Of A Glow Discharge At Atmospheric Pressure Controlled By Dielectric Barrier, Francoise Massines et al., Journal Of Applied Physics, vol. 83, No. 6, Mar. 15, 1998, pp. 2950-2956.

"Stable Glow Plasma At Atmospheric Pressure", S. Kanazawa et al., J. Phys. D: Appl. Phys. 21 (1988) pp. 838-840.

"Application Of Atmospheric Pressure Dielectric Barrier Discharges In Deposition, Cleaning And Activation", O. Goossens et al, Surface & Coatings Technology, 142-144 (2001) 474-481.

Plasma Dictionary; Term: Glow Discharge extracted from hhttp://plasmadictionary.llnl.gov/terms lasso?-MaxRecords=1 &SkinRecords=1&Sort, dated Nov. 13, 2006.

The Cassell Paperback English Dictionary, Cassell Publishers Limited 1990, pages "Infusionism—Ink".

Concise Science Dictionary, Second Edition, Oxford University Press, 1991, pp. 166-167 and 570-571.

"Neus Primerverfahen für Metalloberflachen zur nachfolgenden UV-Lackerung"; Bolte et al., Coatings Feb. 1998, pp. 38-40.

Translation of "Neus Primerverfahern für Metalloberflachen zur nachfolgenden UV-Lackerung"(New Primer Process For Metallic Surfaces For Subsequent UV Lacquering), Bolte et al. 5 pages.

"Glow Discharge Plasma At Atmospheric Pressure And Its Application", S. Okazaki et al. Proc. Jpn. Symp. Plasma Chem./ vol. 2. 1989, pp. 95-102.

"The Improvement Of The Atmospheric-Pressure Glow Plasma Method And The Deposition Of Organic Films", T. Yokoyama et al., J. Phys. D: Appl. Phys. 23, 1990, pp. 374-377.

"The DC Glow Discharge At Atmospheric Pressure", O. Goossens et al., IEEE Transactions On Plasma Science, vol. 30, Feb. 1, 2002, pp. 176-177.

"Gas Breakdown in an Atmospheric Pressure Radio Frequency Capacitive Plasma Source", Park et al., Journal of Applied Physics, vol. 89, No. 1, Jan. 2001.

"Industrial Plasma Engineering", J.R. Roth, Institute of Physics, London (2001), pp. 55-58.

English Translation and Abstract for JP08-078529, 31 pages.
English Translation and Abstract for JP07-328427, 15 pages.
English Translation and Abstract for JP07-062546, 10 pages.
English Translation and Abstract for JP07-138761, 6 pages.
English Translation and Abstract for JP2001-087643, 14 pages.
English Translation and Abstract for JP2000-319427, 24 pages.
English Translation and Abstract for JP2000-192261, 13 pages.
Interlocutory Decision in Opposition Proceedings at the EPO for European Patent No. 1326718, downloaded from www.epoline.org, Jan. 19, 2007, 2 pages.

Grounds For The Decision at the EPO for European Patent No. 1326718, downloaded from www.epoline.org, Jan. 19, 2007, 7 pages.

Decision at the EPO for European Patent No. 1326718, downloaded from www.epoline.org, Dec. 14, 2006, 2 pages.

Maintenance Of The Patent With the Documents Specified In The Final Decision at the EPO for European Patent No. 1326718, downloaded from www.epoline.org, Apr. 28, 2007, 2 pages.

Communication at the EPO for European Patent No. 1326718, downloaded from www.epoline.org, Jan. 19, 2007, 2 pages.

WPI Accession No. 1987-318644 & JP62227905.
WPI Accession No. 1992-395450 & JP4295818.
Kanazawa et al, Nuclear Instruments and Methods in Physical Research 1989, B37/38, 842.

\* cited by examiner

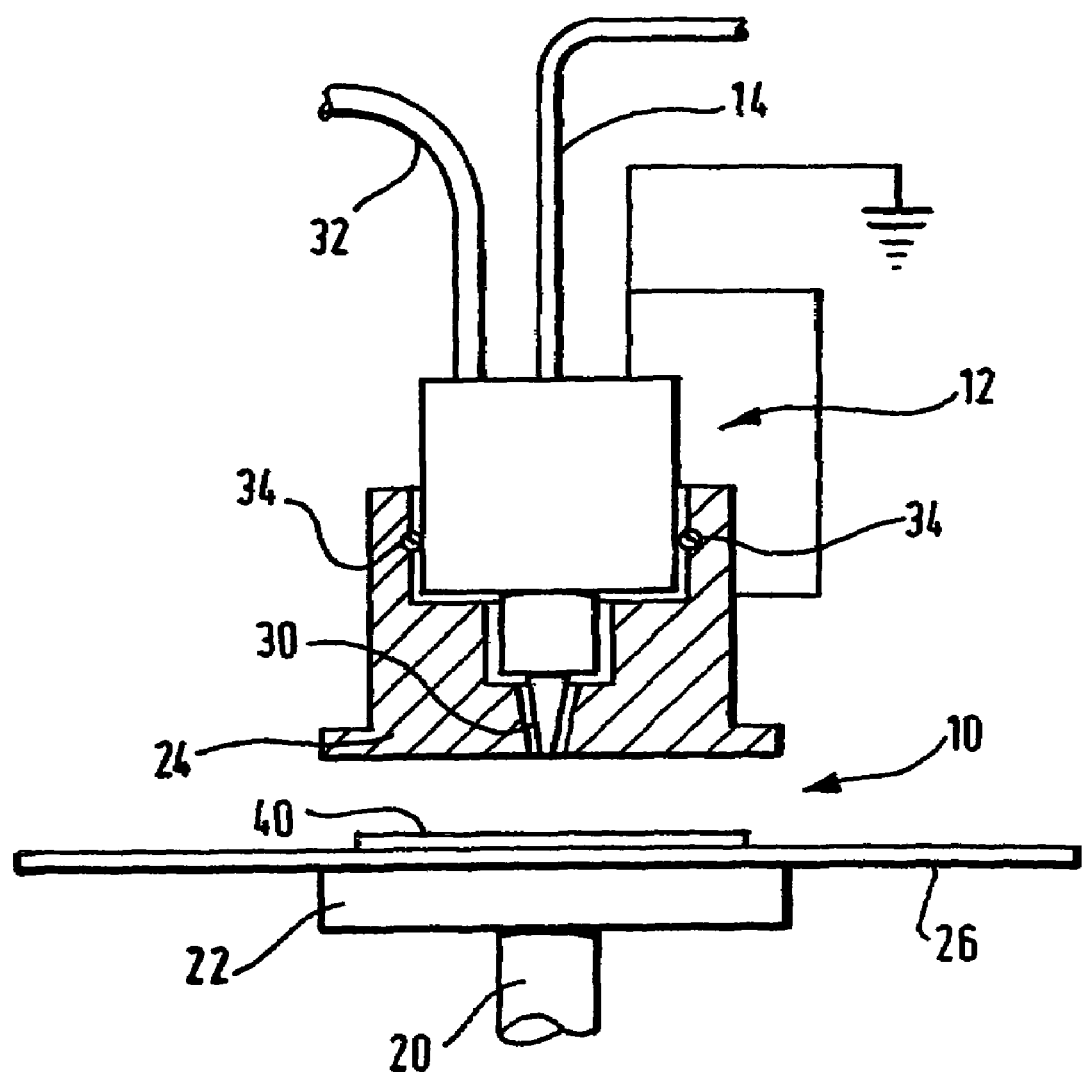

METHOD AND APPARATUS FOR FORMING A COATING

FIELD OF INVENTION

The present invention relates to a method for forming a coating on a substrate, in particular a method for forming a coating on a substrate using an atmospheric pressure plasma discharge, a method for polymerizing a polymer forming material, and further to apparatus for forming a coating on a substrate.

BACKGROUND OF THE INVENTION

Substrates may be coated for a variety of reasons, for example to protect the substrate from corrosion, to provide a barrier to oxidation, to improve adhesion with other materials, to increase surface activity, and for reasons of biomedical compatibility of the substrate. A commonly used method for modifying or coating the surface of a substrate is to place the substrate within a reactor vessel and subject it to a plasma discharge. Many examples of such treatment are known in the art; for example, U.S. Pat. No. 5,876,753 discloses a process for attaching target materials to a solid surface which process includes affixing carbonaceous compounds to a surface by low power variable duty cycle pulsed plasma deposition, and EP-A-0896035 discloses a device having a substrate and a coating, wherein the coating is applied to the substrate by plasma polymerization of a gas comprising at least one organic compound or monomer. DE 19924108, which was first published after the initial priority date of the present application, describes a process for coating dyestuffs and corrosion inhibitors onto substrates. The process involves the application of a liquid film coating onto a substrate and a subsequent plasma polymer protective coating. The plasma polymer coating is formed using gaseous monomers and low pressure plasma.

However, such plasma surface treatments require the substrate to be under conditions of reduced pressure, and hence require a vacuum chamber. Typical coating-forming gas pressures are in the range 5 to 25 $Nm^2$ (cf. 1 atmosphere=$1.01 \times 10^5$ $Nm^{-2}$). As a result of the requirement for reduced pressure, surface treatments are expensive, are limited to batch treatments, and the coating-forming materials must be in gaseous and/or vapor form in order to maintain conditions of reduced pressure.

The present inventors have found that the abovementioned disadvantages of substrate surface plasma treatment can be overcome using a combination of an atmospheric pressure plasma discharge and an atomized liquid and/or solid coating forming material.

DETAILED DESCRIPTION OF THE INVENTION

Thus, according to the present invention there is provided a method for forming a coating on a substrate, which method comprises introducing an atomized liquid and/or solid coating-forming material into an atmospheric pressure plasma discharge and/or an ionized gas stream resulting therefrom, and exposing the substrate to the atomized coating-forming material under conditions of atmospheric pressure.

It is to be understood that the coating forming material in accordance with the present invention is a material which can be used to make any appropriate coating, including, for example, a material which can be used to grow a film or to chemically modify an existing surface.

The present invention also provides a method for polymerizing a polymer-forming material, which method comprises atomizing the polymer-forming material, and exposing the polymer-forming material to an atmospheric pressure plasma discharge.

The present invention further provides apparatus for forming a coating on a substrate, which apparatus comprises means for generating an atmospheric pressure plasma discharge within which, in use, the substrate is placed, an atomizer for providing an atomized coating-forming material within the plasma discharge, and means for supplying a coating forming material to the atomizer.

Any conventional means for generating an atmospheric pressure plasma glow discharge may be used in the present invention, for example atmospheric pressure plasma jet, atmospheric pressure microwave glow discharge and atmospheric pressure glow discharge. Typically such means will employ a helium diluents and a high frequency (e.g. >1 kHz) power supply to generate a homogeneous glow discharge at atmospheric pressure via a Penning ionization mechanism, (see for example, Kanazawa et al, J. Phys. D: Appl. Phys. 1988, 21, 838, Okazaki et al, Proc. Jpn. Symp. Plasma Chem. 1989, 2, 95, Kanazawa et al, Nuclear Instruments and Methods in Physical Research 1989, B37/38, 842, and Yokoyama et al., J. Phys. D: Appl. Phys. 1990, 23, 374).

The coating-forming material may be atomized using any conventional means, for example an ultrasonic nozzle. The atomizer preferably produces a coating-forming material drop size of from 10 to 100 μm, more preferably from 10 to 50 μm. Suitable atomizers for use in the present invention are ultrasonic nozzles from Sono-Tek Corporation, Milton, N.Y., USA. The apparatus of the present invention may include a plurality of atomizers, which may be of particular utility, for example, where the apparatus is to be used to form a copolymer coating on a substrate from two different coating-forming materials, where the monomers are immiscible or are in different phases, e.g. the first is a solid and the second is gaseous or liquid.

The present invention may be used to form many different types of substrate coatings. The type of coating which is formed on the substrate is determined by the coating-forming material(s) used, and the present method may be used to (co)polymerize coating-forming monomer material(s) onto the substrate surface. The coating-forming material may be organic or inorganic, solid, liquid or gaseous, or mixtures thereof. Suitable organic coating-forming materials may be selected from the group of carboxylates, methacrylates, acrylates, styrenes, methacrylonitriles, alkenes and dienes, for example methyl methacrylate, ethyl methacrylate, propyl methacrylate, butyl methacrylate, and other alkyl methacrylates, and the corresponding acrylates, including organofunctional methacrylates and acrylates, including glycidyl methacrylate, trimethoxysilyl propyl methacrylate, allyl methacrylate, hydroxyethyl methacrylate, hydroxypropyl methacrylate, dialkylaminoalkyl methacrylates, and fluoroalkyl (meth)acrylates, methacrylic acid, acrylic acid, fumaric acid and esters, itaconic acid (and esters), maleic anhydride, styrene, α-methylstyrene, halogenated alkenes, for example, vinyl halides, such as vinyl chlorides and vinyl fluorides, and fluorinated alkenes, for example perfluoroalkenes, acrylonitrile, methacrylonitrile, ethylene, propylene, allyl amine, vinylidene halides, butadienes, acrylamide, such as N-isopropylacrylamide, methacrylamide, epoxy compounds, for example glycidoxypropyltrimethoxysilane, glycidol, styrene oxide, butadiene monoxide, ethyleneglycol diglycidylether, glycidyl methacrylate, bisphenol A diglycidylether (and its oligomers), vinylcyclohexene oxide, conducting polymers such as pyrrole and thiophene and their derivatives, and phosphorus-containing compounds, for example dimethylallylphosphonate. Suitable inorganic coating-forming materials include metals and metal oxides, including colloidal metals. Organometallic compounds may also be suitable coating-forming materials, including metal alkoxides such as titanates, tin alkoxides, zirconates and alkoxides of germanium and erbium. However, the present inventors have found that the present invention has particular utility in providing substrates with silica- or siloxane-based coatings using coating-forming compositions comprising silicon-containing materials. Suitable silicon-containing materials for use in the method of the present invention may be selected from the group of silanes (for example, silane, alkylhalosilanes, alkoxysilanes) and linear (for example, polydimethylsiloxane) and cyclic siloxanes (for example, octamethylcyclotetrasiloxane), including organo-functional linear and cyclic siloxanes (for example, Si—H containing, halo-functional, and haloalkyl-functional linear and cyclic siloxanes, e.g. tetramethylcyclotetrasiloxane and tri(nonofluorobutyl)trimethylcyclotrisiloxane). A mixture of different silicon-containing materials may be used, for example to tailor the physical properties of the substrate coating for a specified need (e.g. thermal properties, optical properties, such as refractive index, and viscoelastic properties).

In addition, under oxidizing conditions the present method may be used to form an oxygen containing coating on the substrate. For example, silica-based coatings can be formed on the substrate surface from atomized silicon-containing coating-forming materials. Under reducing conditions, the present method may be used to form oxygen free coatings, for example, silicon carbide based coatings may be formed from atomized silicon containing coating forming materials.

Plasma generating conditions containing gases other than oxygen may also be employed, for example noble gases, air, hydrogen, nitrogen and ammonia. In a nitrogen containing atmosphere nitrogen can bind to the substrate surface, and in an atmosphere containing both nitrogen and oxygen, nitrates can bind to and/or form on the substrate surface. Such gases may also be used to pre-treat the substrate surface prior to exposure to the coating forming substance. For example oxygen containing plasma treatment of the substrate may provide improved adhesion with the applied coating. The oxygen containing plasma being generated by introducing oxygen containing materials to the plasma such as oxygen gas or water. Furthermore, the coating formed on the substrate may be post treated in a range of plasma conditions. For example, siloxane derived coatings may be further oxidized by oxygen containing plasma treatment. The oxygen containing plasma being generated by introducing oxygen containing materials to the plasma such as oxygen gas or water.

An advantage of the present invention over the prior art is that both liquid and solid atomized coating-forming materials may be used to form substrate coatings, due to the method of the present invention taking place under conditions of atmospheric pressure. Furthermore the coating-forming materials can be introduced into the plasma discharge or resulting stream in the absence of a carrier gas, i.e. they can be introduced directly by, for example, direct injection, whereby the coating forming materials are injected directly into the plasma.

As mentioned above, the present inventors have found particular utility of the present invention for forming silica- and siloxane-based coatings on substrates using silicon-containing materials. Under oxidizing conditions, e.g. an oxygen containing atmosphere, silica-based coatings can be formed on the substrate surface from atomized silicon-containing materials, whereas under non-oxidizing conditions a siloxane polymer, e.g. a linear, branched or resinous siloxane polymer, can be formed on the substrate surface from atomization of a silicon-containing monomer. A siloxane-organic copolymer can be formed on the substrate surface by use of a mixture of organic and silicon-containing monomers. Furthermore, a silica-based coating may be formed on a substrate surface, which may in turn be coated by a further material, for example an organic or siloxane polymer. For example, when a siloxane is mixed with an organic polymer and a substrate formed from said mixture, the siloxane will migrate to the surface of the organic polymeric body of the substrate, due to the difference in surface energy between organic polymers and siloxanes. If this substrate is then subjected to atmospheric pressure plasma treatment, the siloxane on the surface of the substrate is oxidized to form a silica-based coating. This silica-based coating may then be subjected to treatment according to the present invention, by further subjecting it to atmospheric pressure plasma treatment in the presence of atomized silicon-containing monomers, to form a siloxane coating thereon. However, the present invention is also useful for forming an organic coating on a substrate, for example a polyacrylic acid or perfluoro-organic coating.

The substrate to be coated may comprise any material, for example metal, ceramic, plastics, siloxane, woven or non-woven fibers, natural fibers, synthetic fibers cellulosic material and powder. However, the size of the substrate is limited by the dimensions of the volume within which the atmospheric pressure plasma discharge is generated, i.e. the distance between the electrodes of the means for generating the plasma. For typical plasma generating apparatus, the plasma is generated within a gap of from 5 to 50 mm, for example 12 to 25 mm. Thus, the present invention has particular utility for coating films, fibers and powders.

Substrates coated by the method of the present invention may have various utilities. For example, a silica-based coating, generated in an oxidizing atmosphere, may enhance the barrier and/or diffusion properties of the substrate, and may enhance the ability of additional materials to adhere to the substrate surface; a halo-functional organic or siloxane coating (e.g. perfluoroalkenes) may increase hydrophobicity, oleophobicity, fuel and soil resistance, and/or the release properties of the substrate; a polydimethylsiloxane coating may enhance water resistance and release properties of the substrate, and may enhance the softness of fabrics to touch; a polyacrylic acid polymeric coating may be used as an adhesive layer to promote adhesion to substrate surface or as part of laminated structure; the inclusion of colloidal metal species in the coatings may provide surface conductivity to the substrate, or enhance its optical properties. Polythiophene and polypyrrole give electrically conductive polymeric coatings which may also provide corrosion resistance on metallic substrates.

One major problem which tends to occur when coating substrates using a process involving plasma treatment is that the chemical properties of the material used to form the coating may be lost. It is therefore a major advantage of the present invention that the chemical properties of the coating forming material are substantially retained in the coating formed. For example, in the case where acrylic acid is used as the coating forming material, the carboxylic acid functionality is substantially maintained in the coating formed.

The present invention also provides a method of producing a substrate having a multi-layered coating by the above described processes. In this case a layer of the coating is applied upon each repeat pass of the substrate through the atmospheric plasma glow discharge. Preferably in such a case the substrate may be coated on a continuous basis by being transported through an atmospheric plasma glow discharge by way of a reel to reel process in which the substrate travels from a first reel, through the glow discharge and on to a second reel at a constant speed to ensure that all the substrate has a predetermined residence time within the glow discharge. Each substrate may be subjected to one or more passes through the glow discharge whereby the first or supply reel in the first pass becomes the substrate collecting reel in the second pass and the substrate collecting reel of the first pass in turn is the supply reel in the second pass, the two reels changing over at the end of each pass. Alternatively the substrate may be passed through a series of atmospheric glow discharge chambers.

Preferred uses of the coatings of the substrates coated in accordance with the present invention include lamination adhesives, oxygen and/or moisture barrier for example for food packaging applications and as a component in or on organic light emitting diode devices in, for example, flat panel displays.

The present invention will now be illustrated in detail with reference to the accompanying drawing, in which FIG. 1 shows an embodiment of apparatus according to the present invention.

The apparatus according to the present invention shown in FIG. 1 comprises means for generating an atmospheric pressure plasma discharge (generally designated 10), and an atomizer (generally designated 12) connected to a syringe pump 14 for supplying a coating forming material to the atomizer 12. The means for generating the discharge 10 includes a high voltage 15 kHz ac power supply 20, supplied across two aluminum electrodes 22 and 24 spaced 12 mm apart, with the lower live electrode 22 shielded by a glass dielectric plate 26. The atomizer 12 includes a Sono-tek* 8700-120 ultrasonic nozzle 30, and is connected to a Sono-tek* 06-05108 broadband ultrasonic generator 32. The atomizer 12 is seated within the earth electrode 24 on an O-ring 34. The substrate 40 to be coated is placed on the glass dielectric plate 26 between the electrodes 22 and 24.

The apparatus described hereinabove with reference to FIG. 1 was used for all the procedures described hereinafter.

(* Sono-tek Corporation, Milton, N.Y. 12547, USA).

EXAMPLES

Example 1

A piece of polyethylene film substrate was ultrasonically washed in a 1:1 mixture of isopropyl alcohol and cyclohexane and was placed on the glass plate. After evacuation of residual gas, the plasma discharge gas was introduced at a flow rate of 1900 sccm and a pressure of $1.02 \times 10^5$ Nm$^{-2}$. Two discharge gasses were used, helium and a 99% helium/1% oxygen mixture. After 10 minutes of purging, the syringe pump 14 was switched on and the coating-forming material was allowed to flow at a rate of $3 \times 10^{-5}$ mls$^{-1}$. Two coating-forming materials were used, octamethylcyclotetra-siloxane (hereinafter referred to as "$D_4$") and tetramethylcyclotetrasiloxane (hereinafter referred to as "$D_4H$"). When the coating-forming material reached the ultrasonic nozzle, the ultrasonic generator was switched on (2.5 W) to initiate atomization of the coating-forming material, and the atmospheric pressure plasma discharge was ignited by applying 1.5 kV across the electrodes. Deposition of the coating-forming material was allowed to proceed for 10 minutes, following which the substrate was removed and placed under vacuum for 20 minutes to remove any labile material.

The results of the above procedure are shown in Table 1 below. X-ray photoelectron spectroscopic analysis (Kratos ES300) was used to perform elemental analysis of the substrate surface, and a spectrophotometer (Aquila Instruments nkd-6000) was used to determine film thickness. Contact angle measurements were made using video capture apparatus (AST Products VCA2500XE) using sessile 2 μl droplets of deionised water.

Gas permeation measurements of the substrate surface were also taken using a mass spectrometer, and the results are shown in Table 2. The Barrier Improvement Factor is calculated as [coated substrate gas permeation]/[reference sample gas permeation].

TABLE 1

| Sample | XPS analysis | | | | Contact Angle (°) | Deposition rate (nms$^{-1}$) | Coating thickness (nm) |
| --- | --- | --- | --- | --- | --- | --- | --- |
| | % C | % O | % Si | % SiO$_x$ | | | |
| D$_4$ theory | 50 | 25 | 25 | 0 | — | — | — |
| D$_4$ 100% He | 43.3 | 29.3 | 25.8 | | 107.8* | 28 | 279 |
| D$_4$ 1% O$_2$ | 25.5 | 48.5 | 26.0 | 74.4 | 56.4 | 29 | 286 |
| D$_4$H theory | 33.3 | 33.3 | 33.3 | 0 | — | — | — |
| D$_4$H 100% He | 32.5 | 39.1 | 28.4 | | 102.3 | 82 | |
| D$_4$H 1% O$_2$ | 9.2 | 61.4 | 29.5 | 81.5 | wets | | 244 |

*clean polyethylene has a contact angle of 105.8°

TABLE 2

| Sample | Barrier Improvement Factor |
| --- | --- |
| Clean polyethylene | 1.0 (by definition) |
| D$_4$, 100% He | 0.9 |
| D$_4$, 1% O$_2$ | 6.8 |
| D$_4$H, 100% He | 0.9 |
| D$_4$H, .1% O$_2$ | 4.5 |

ATR-FTIR studies of the substrate surfaces showed that ring-opening polymerization of the D$_4$ and D$_4$H coating-forming materials had occurred to form a polysiloxane on the substrate surface. In particular, the ATR-FTIR studies on the latter showed that the polysiloxane coating retained much of the D$_4$H Si—H functionality.

NMR studies of a coating prepared as described above on a glass surface showed that the polysiloxane formed on the substrate surface by polymerization of the D$_4$ and D$_4$H coating-forming materials comprised divalent (CH$_3$)$_2$SiO$_{2/2}$ units and trivalent CH$_3$SiO$_{3/2}$ units, i.e. the polysiloxane is resinous.

Example 2

The method of Example 1 above was repeated using a glass substrate and acrylic acid as the coating-forming material, and helium alone as the discharge gas. The coating was removed from the substrate prior to analysis.

FTIR and solid state NMR analysis of the coating confirmed that the acrylic acid had polymerized to form polyacrylic acid. Both FTIR and NMR data showed consumption of the unsaturated C=C bond.

Example 3

The method of Example 2 was repeated, but using nylon and polyethylene substrates.

An FTIR analysis comparison of the coating with commercially available polyacrylic acid confirmed that the acrylic acid coating-forming material had polymerized to form a polyacrylic acid coating on the substrate surfaces.

X-ray photoelectron spectroscopic analysis, film thickness analysis, and contact angle measurements were performed per Example 1 above. The results are shown in Table 3 below.

TABLE 3

|  | XPS analysis | | | Contact Angle (°) | Deposition rate (nms$^{-1}$) |
| --- | --- | --- | --- | --- | --- |
|  | % C | % O | % CO$_2$H |  |  |
| Theory | 60.0 | 40.0 | 33.3 | — | — |
| Commercial polyacrylic acid | 63.3 | 36.7 | 29.9 | wets | — |
| Example 3 coating | 62.6 | 37.4 | 26.4 | wets | 231 ± 95 |

Gas transport through the coated polyethylene film was determined by mass spectrometry, and the barrier improvement factor calculated per Example 1 above over an untreated polyethylene substrate and commercially available polyacrylic acid. The results are shown in Table 4 below.

TABLE 4

| Sample | Barrier Improvement Factor |
| --- | --- |
| Untreated substrate | 1.0 (by definition) |
| Commercial polyacrylic acid | 1.1 ± 0.1 |
| Example 3 coating | 7.2 ± 0.9 |

A lap shear test was performed on the coated nylon substrates as follows.

Two opposing faces of coated nylon substrates were overlapped to create a joint covering 1 cm$^2$, and the substrates were cured under a 2 kg weight at 70° C. for 60 minutes. The adhesive strength of each joint was then determined by pulling the substrates apart at a rate of 5 mm per minute using a tensilometer (Instron), and recording the maximum load reached prior to failure. The coated substrates withstood a maximum load of 74±11 Ncm$^{-2}$ prior to failure. Comparison joints made from uncoated nylon displayed no adhesive properties.

Example 4

The method of Example 2 was repeated, using a glass substrate and 1H,1H,2H-perfluoro-1-octene (CF$_3$(CF$_2$)$_5$CH=CH$_2$) as the coating-forming material.

X-ray photoelectron spectroscopic analysis, FTIR analysis and contact angle measurements (with water and decane) were performed per Example 1 above, and results are shown in Table 5 below. The XPS and FTIR analysis showed that the glass substrate coating was rich in CF$_2$ and CF$_3$ and the contact angles for water and decane were determined as per example 1.

TABLE 5

|  | XPS analysis | | | Contact Angle (water) (°) | Contact Angle (decane) (°) |
| --- | --- | --- | --- | --- | --- |
|  | % C | % F | % O |  |  |
| Theory | 38.1 | 61.9 | — | — | — |
| Example 4 coating | 38.0 | 60.0 | 2.1 | 118.9 ± 3.0 | 61.1 ± 2.2 |

The contact angle measurement results show that the glass substrate has been rendered substantially

The invention claimed is:

1. A method for polymerizing a polymer forming material, which method comprises atomizing the polymer-forming material selected from the group consisting of:
   (i) an atomized liquid, and
   (ii) a combination of an atomized liquid and an atomized solid, exposing (i) or (ii) to a homogeneous atmospheric pressure plasma glow discharge, and exposing a substrate to (i) or (ii).

2. A method for co-polymerizing a liquid coating-forming monomer material under conditions of atmospheric pressure, which method comprises atomizing the liquid coating-forming monomer material, exposing the atomized liquid coating-forming monomer material to a homogeneous atmospheric pressure plasma glow discharge, and exposing a substrate to the atomized liquid coating-forming monomer material.

3. A method for co-polymerizing a solid coating-forming monomer material under conditions of atmospheric pressure, which method comprises atomizing the solid coating-forming monomer material, exposing the atomized solid coating-forming monomer material to a homogeneous atmospheric pressure plasma glow discharge, and exposing a substrate to the atomized solid coating-forming monomer material.

4. A method for forming a coating on a substrate under conditions of atmospheric pressure, the method comprising:
   (I) introducing a coating-forming material selected from the group consisting of:
      (i) an atomized liquid, and
      (ii) a combination of an atomized liquid and an atomized solid, into an atmosphere selected from:
         (a) a homogeneous atmospheric pressure plasma glow discharge and
         (b) an ionized gas stream resulting therefrom, and
   (II) exposing the substrate to (i) or (ii).

5. A method according to claim 4 wherein the coating-forming material is introduced in the absence of a carrier gas.

6. A method according to claim 4 wherein the coating-forming material is a silicon-containing material.

7. A method according to claim 4 wherein the coating-forming material is selected from a group consisting of (i) dimethylsiloxane and (ii) a siloxane having silicon-hydrogen bonds.

8. A method according to claim 4 wherein the plasma is generated in an oxygen containing atmosphere.

9. A method according to claim 4 wherein the coating-forming material is selected from a group consisting of:
   (i) an organic material, and
   (ii) an organometallic material.

10. A method according to claim 9 wherein the coating-forming material is selected from the group consisting of:
   (i) acrylic acid and
   (ii) a perfluoroalkene.

11. A method according to claim 4 wherein the substrate is selected from the group consisting of:
(i) metal,
(ii) ceramic,
(iii) plastics,
(iv) woven fibers,
(v) non-woven fibers,
(vi) natural fibers,
(vii) synthetic fibers,
(viii) cellulosic material, and
(ix) powder.

12. A method according to claim 4 wherein the coating increases at least one of the properties selected from the group consisting of:
(i) adhesive properties,
(ii) release properties,
(iii) gas barrier properties,
(iv) moisture barrier properties,
(v) electrical properties,
(vi) thermal conductivity properties,
(vii) optical properties,
(viii) dielectric properties,
(ix) hydrophilic properties,
(x) hydrophobic properties, and
(xi) oeophobic properties of the substrate.

13. A method of producing a substrate having a multi-layered coating according to claim 4 whereby the coating is applied by repeatedly passing the substrate through the homogeneous atmospheric pressure plasma glow discharge.

14. A method according to claim 4 wherein the chemical properties of the atomized liquid forming material are substantially retained in the resulting coating.

15. A method in accordance with claim 4 wherein the substrate is coated continuously by use of a reel to reel apparatus.

16. A method in accordance with claim 4 wherein the substrate is pre-treated by exposure to plasma prior to the introduction of coating-forming material.

17. A method in accordance with claim 16 wherein an oxygen containing material is added to the plasma.

18. A method in accordance with claim 17 wherein the oxygen containing material is selected from the group consisting of:
(i) oxygen gas and
(ii) water.

19. A method in accordance with claim 4 wherein the coating formed on the substrate is post-treated by exposure to plasma.

20. A method of producing a substrate having a multi-layered coating according to claim 4 by passing said substrate through a series of homogeneous atmospheric pressure plasma glow discharge chambers.

21. A method according to claim 4 wherein the chemical properties of the atomized solid coating-forming material from the atomized liquid are substantially retained in the resulting coating.

* * * * *